(12) United States Patent
Corisis et al.

(10) Patent No.: US 8,445,997 B2
(45) Date of Patent: May 21, 2013

(54) STACKED PACKAGED INTEGRATED CIRCUIT DEVICES

(75) Inventors: David J. Corisis, Nampa, ID (US); Chin Hui Chong, Singapore (SG); Choon Kuan Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/361,073

(22) Filed: Jan. 30, 2012

(65) Prior Publication Data

US 2012/0127685 A1    May 24, 2012

Related U.S. Application Data

(62) Division of application No. 11/749,336, filed on May 16, 2007, now Pat. No. 8,106,491.

(51) Int. Cl.
*H01L 21/58* (2006.01)
*H01L 23/02* (2006.01)
*H01L 23/495* (2006.01)

(52) U.S. Cl.
USPC .... 257/672; 257/678; 257/686; 257/E23.194; 438/109; 438/123

(58) Field of Classification Search
USPC .......... 257/672, 678, 686, E23.194; 438/109, 438/123
See application file for complete search history.

(56) References Cited

U.S. PATENT DOCUMENTS

| | | | |
|---|---|---|---|
| 4,956,746 A | 9/1990 | Gates, Jr. et al. | |
| 5,128,831 A | 7/1992 | Fox, III et al. | |
| 5,587,341 A | 12/1996 | Masayuki et al. | |
| 5,677,567 A | 10/1997 | Ma et al. | |
| 5,814,881 A | 9/1998 | Alagaratnam et al. | |
| 6,020,629 A | 2/2000 | Farnworth et al. | |
| 6,163,076 A | 12/2000 | Lee et al. | |
| 6,212,767 B1 | 4/2001 | Tandy | |
| 6,242,285 B1 | 6/2001 | Kang | |
| 6,271,056 B1 | 8/2001 | Farnworth et al. | |
| 6,303,981 B1 | 10/2001 | Moden | |
| 6,339,255 B1 | 1/2002 | Shin | |
| 6,404,044 B2 | 6/2002 | Akram et al. | |
| 6,476,475 B1 | 11/2002 | Lee | |

(Continued)

FOREIGN PATENT DOCUMENTS

| | | |
|---|---|---|
| JP | 03295266 A | 12/1991 |
| JP | 03295566 A | 12/1991 |
| JP | 2001274324 A | 10/2001 |

OTHER PUBLICATIONS

Office Action mailed Nov. 16, 2010 in Japan Application No. 2008-128925, 6 pages.

(Continued)

*Primary Examiner* — Lynne Gurley
*Assistant Examiner* — Vernon P Webb
(74) *Attorney, Agent, or Firm* — Perkins Coie LLP

(57) ABSTRACT

A device is disclosed which includes a first packaged integrated circuit device, a second packaged integrated circuit device positioned above the first packaged integrated circuit device and a plurality of planar conductive members conductively coupling the first and second packaged integrated circuit devices to one another. A method is also disclosed which includes conductively coupling a plurality of extensions on a leadframe to each of a pair of stacked packaged integrated circuit devices and cutting the leadframe to singulate the extensions from one another.

10 Claims, 5 Drawing Sheets

U.S. PATENT DOCUMENTS

| | | |
|---|---|---|
| 6,583,502 B2 | 6/2003 | Lee et al. |
| 6,583,503 B2 | 6/2003 | Akram et al. |
| 6,650,019 B2 | 11/2003 | Glenn et al. |
| 6,700,206 B2 | 3/2004 | Kinsman |
| 6,753,207 B2 | 6/2004 | Hur |
| 6,787,917 B2 | 9/2004 | Lee et al. |
| 6,798,057 B2 | 9/2004 | Bolkin et al. |
| 6,833,613 B1 | 12/2004 | Akram et al. |
| 6,836,007 B2 | 12/2004 | Michii et al. |
| 6,900,528 B2 | 5/2005 | Mess et al. |
| 6,949,834 B2 | 9/2005 | Connell et al. |
| 7,006,360 B2 | 2/2006 | Kim |
| 7,064,426 B2 | 6/2006 | Karnezos |
| 7,115,442 B2 | 10/2006 | Baik et al. |
| 7,208,828 B2 | 4/2007 | Cher 'Khng et al. |
| 7,211,900 B2 | 5/2007 | Shin et al |
| 2001/0023088 A1 | 9/2001 | Masuda et al. |
| 2003/0038347 A1* | 2/2003 | Chiu et al. .................. 257/678 |
| 2003/0203540 A1 | 10/2003 | Hur |
| 2007/0181989 A1 | 8/2007 | Corisis et al. |
| 2008/0283977 A1 | 11/2008 | Corisis et al. |

OTHER PUBLICATIONS

Decision of Rejection mailed Dec. 13, 2011 in Japan Application No. 2008-128925, 6 pages.

* cited by examiner

STACKED PACKAGED INTEGRATED CIRCUIT DEVICES

CROSS-REFERENCE TO RELATED APPLICATION

This application is a divisional of U.S. application Ser. No. 11/749,336 filed May 16, 2007, now U.S. Pat. No. 8,106,491, which is incorporated herein by reference in its entirety.

BACKGROUND OF THE INVENTION

1. Technical Field

This subject matter disclosed herein is generally directed to the field of packaging integrated circuit devices, and, more particularly, to stacked packaged integrated circuit devices and various methods of making same.

2. Description of the Related Art

Integrated circuit technology uses electrical devices, e.g., transistors, resistors, capacitors, etc., to formulate vast arrays of functional circuits. The complexity of these circuits requires the use of an ever-increasing number of linked electrical devices so that the circuit may perform its intended function. As the number of transistors increases, the integrated circuitry dimensions shrink. One challenge in the semiconductor industry is to develop improved methods for electrically connecting and packaging circuit devices which are fabricated on the same and/or on different wafers or chips. In general, it is desirable in the semiconductor industry to construct transistors which occupy less surface area on the silicon chip/die.

In the manufacture of semiconductor device assemblies, a single semiconductor die is most commonly incorporated into each sealed package. Many different package styles are used, including dual inline packages (DIP), zig-zag inline packages (ZIP), small outline J-bends (SOJ), thin small outline packages (TSOP), plastic leaded chip carriers (PLCC), small outline integrated circuits (SOIC), plastic quad flat packs (PQFP) and interdigitated leadframe (IDF). Some semiconductor device assemblies are connected to a substrate, such as a circuit board, prior to encapsulation. Manufacturers are under constant pressure to reduce the size of the packaged integrated circuit device and to increase the packaging density in packaging integrated circuit devices.

In some cases, packaged integrated circuit devices have been stacked on top of one another in an effort to conserve plot space. Prior art techniques for conductively coupling the stacked packaged integrated circuit devices to one another typically involved the formation of solder balls or wire bonds to establish this connection. What is desired is a new and improved technique for conductively coupling stacked packaged devices to one another.

BRIEF DESCRIPTION OF THE DRAWINGS

The present subject matter may be understood by reference to the following description taken in conjunction with the accompanying drawings, in which like reference numerals identify like elements, and in which.

Figure 1:
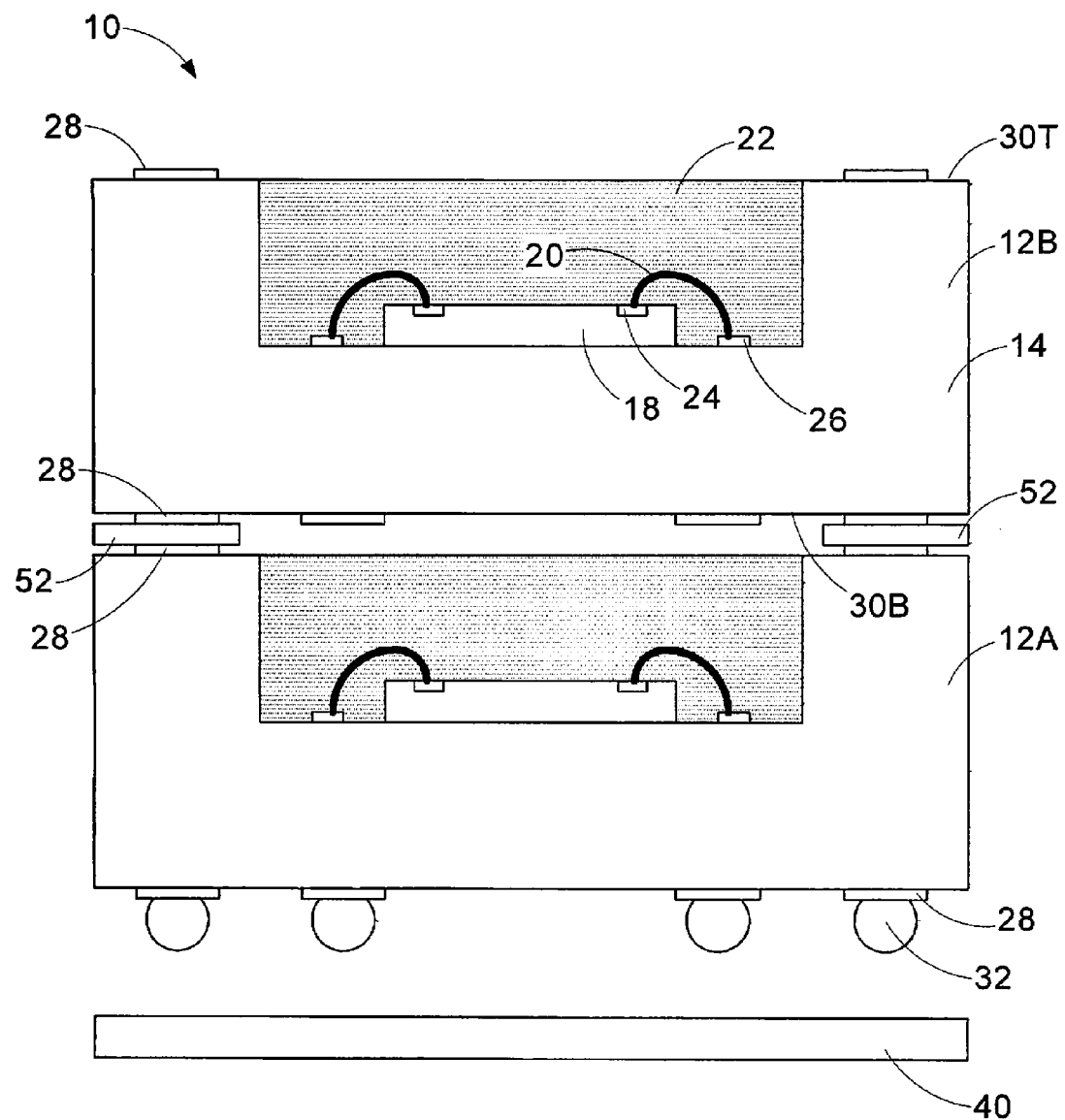
FIGS. 1 and 2 are various views of a stacked packaged integrated circuit device in accordance with one aspect of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Although various regions and structures shown in the drawings are depicted as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the subject matter disclosed herein.

FIG. 1 depicts an illustrative stacked die package 10 in accordance with one aspect of the present disclosure. A first packaged integrated circuit device 12A is positioned beneath a second packaged circuit device 12B. A plurality of solder balls 32 or other known techniques may be employed to conductively couple the first packaged integrated circuit device 12A to an illustrative printed circuit board 40. As will be recognized by those skilled in the art after a complete reading of the present application, the first packaged integrated circuit device 12A and second packaged circuit device 12B may be the same type of integrated circuit device or they may be different from one another. For example, the first packaged integrated circuit device 12A may be a packaged DRAM device while the second packaged circuit device 12B may be a NAND device. Additionally, the first packaged integrated circuit device 12A and second packaged circuit device 12B may be in packages having different physical package sizes. In the illustrative example discussed herein, the first packaged integrated circuit device 12A and second packaged circuit device 12B have the same approximate package size. Additionally, using the methodologies disclosed herein, the stacked die package 10 may comprise more than the two illustrative packaged devices 12A, 12B depicted in FIG. 1. For example, 3-5 packaged integrated circuit devices may be positioned in a single stack 10 using the structures and methods disclosed herein.

In the disclosed example, each of the first packaged integrated circuit device 12A and the second packaged circuit device 12B comprise a printed circuit board 14 with a cavity 16 formed therein. An integrated circuit die 18 is secured within the cavity 16 in accordance with traditional techniques, e.g., an adhesive material. Illustrative wire bonds 20 are used to conductively couple the bond pads 24 on the die 18 and the bond pads 26 on the printed circuit board 14. Traditional mold compound material 22 may be used to fill the cavity 16.

Figure 2:
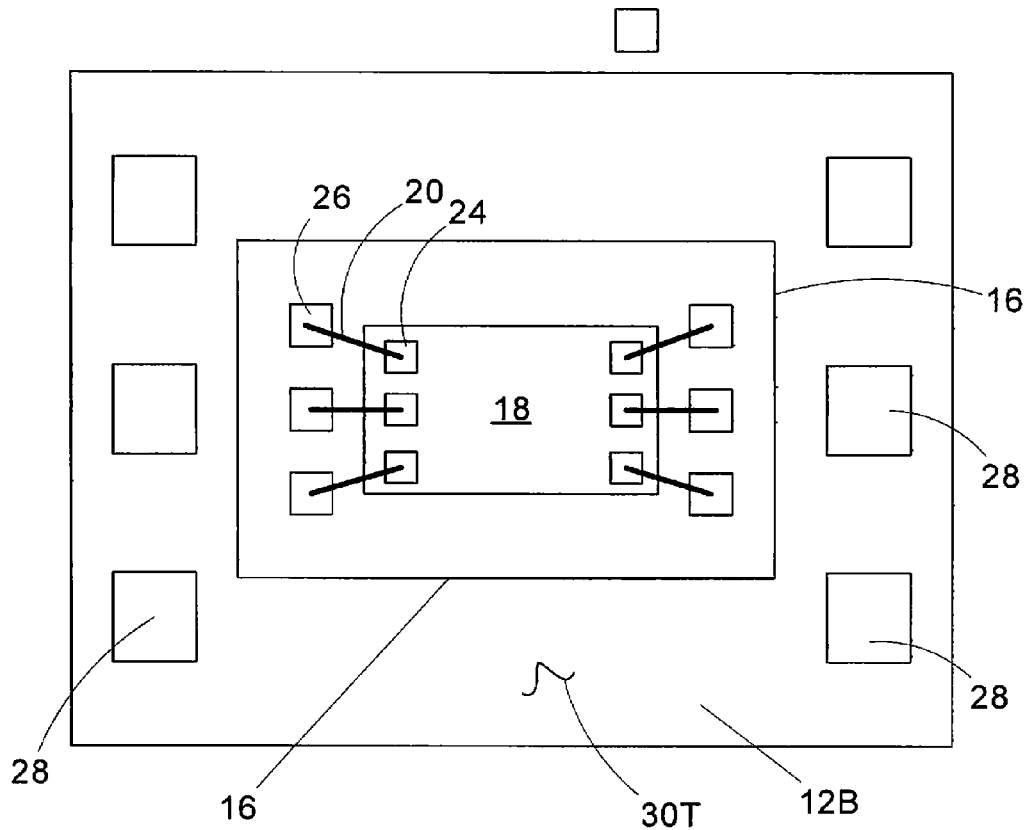

A plurality of conductive terminals 28 may be formed on the top surface 30T and the bottom surface 30B of the first packaged integrated circuit device 12A and the second packaged circuit device 12B. FIG. 2 is a top view of the second packaged integrated circuit device 12B (without the mold compound material 22), wherein an illustrative layout of the conductive terminals 28 is depicted. Of course, the particular layout or arrangement of the conductive terminals 28 may vary depending upon the particular application.

Figure 3:
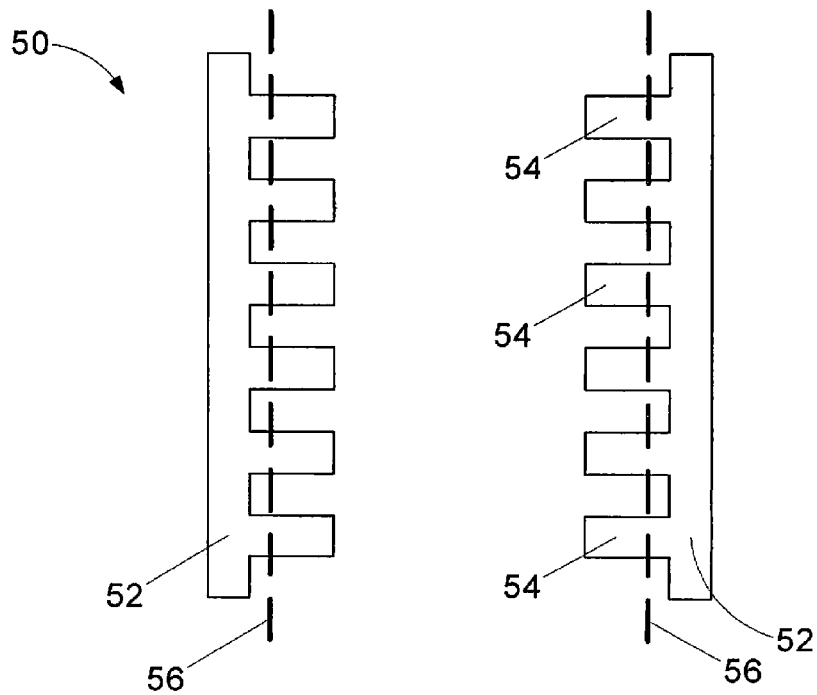
FIG. 3 is a view of illustrative portions of a leadframe that may be employed as described herein.

FIGS. 3-7 depict one illustrative method of forming the stacked packaged die 10 disclosed herein. FIG. 3 depicts a portion of an illustrative leadframe 50 that may be employed in packaging integrated circuit devices. The leadframe 50 comprises a plurality of tie bars 52, each of which have a plurality of leadframe extensions 54 that physically extend from the bar 52. The size, number and spacing of the leadframe extensions 54 may vary depending upon the particular application. In one example, the extensions 54 are planar plate structures that have a thickness ranging from approximately 50-150 μm. The other physical dimensions, e.g., length, width, as well as the general configuration of the extension, may vary. As will be recognized by those skilled in the art after a complete reading of the present application, the size and pitch of the extensions 54 will be coordinated to match the size and pitch of the conductive terminals 28 to which the extensions 54 will, ultimately, be conductively coupled. The extensions 54 may be comprised of a variety of conductive materials, e.g., copper, alloy 42, etc. Depending upon the material of the extensions 54, a surface protectant may be applied to the extensions 54 for a variety of reasons, e.g., to prevent oxidation. In some applications, the extensions 54 may be coated with a material such that a wettable surface is created, e.g., a coating of silver, tin, gold/nickel, etc. Such a coating may have a thickness of approximately 0.25-4.0 μm. Additionally, in some applications, gold or copper stud bumps could be employed on the extensions 54 to make the connection from the extensions 54 to the packaged integrated circuit devices 12A, 12B.

Figure 4:
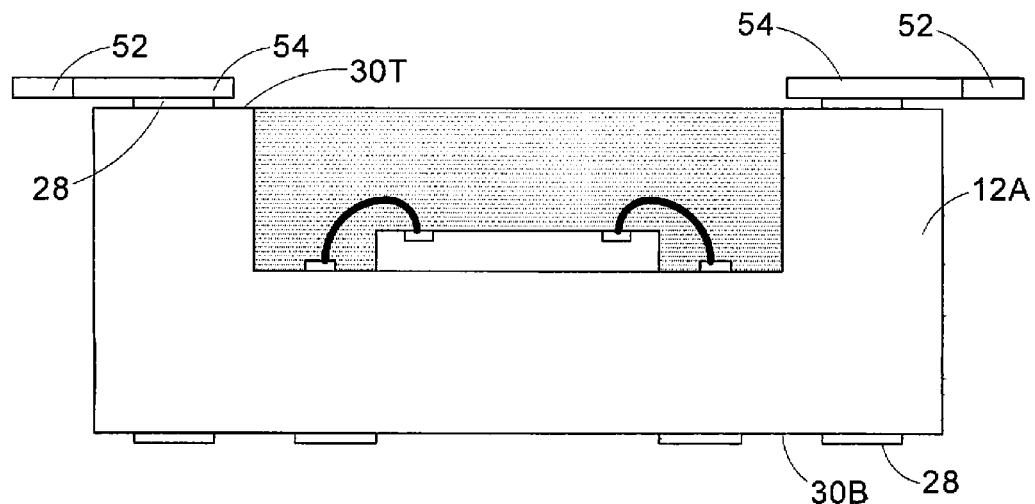
FIGS. 4-7 depict one illustrative process flow for forming stacked packaged integrated circuit devices as described herein.

As shown in FIG. 4, the leadframe 50 is conductively coupled to the conductive terminals 28 on the top surface 30T of the first packaged integrated circuit device 12A. In one specific example, a solder flux is applied to the extensions 54 and/or to the conductive terminals 28 on the top surface 30T of the first packaged integrated circuit device 12A. The leadframe 50 is aligned and positioned such that the extensions 54 contact the conductive terminals 28. A first heat treatment process is then performed to reflow the solder to thereby conductively couple the extensions 54 and the conductive terminals 28 to one another.

Figure 5:
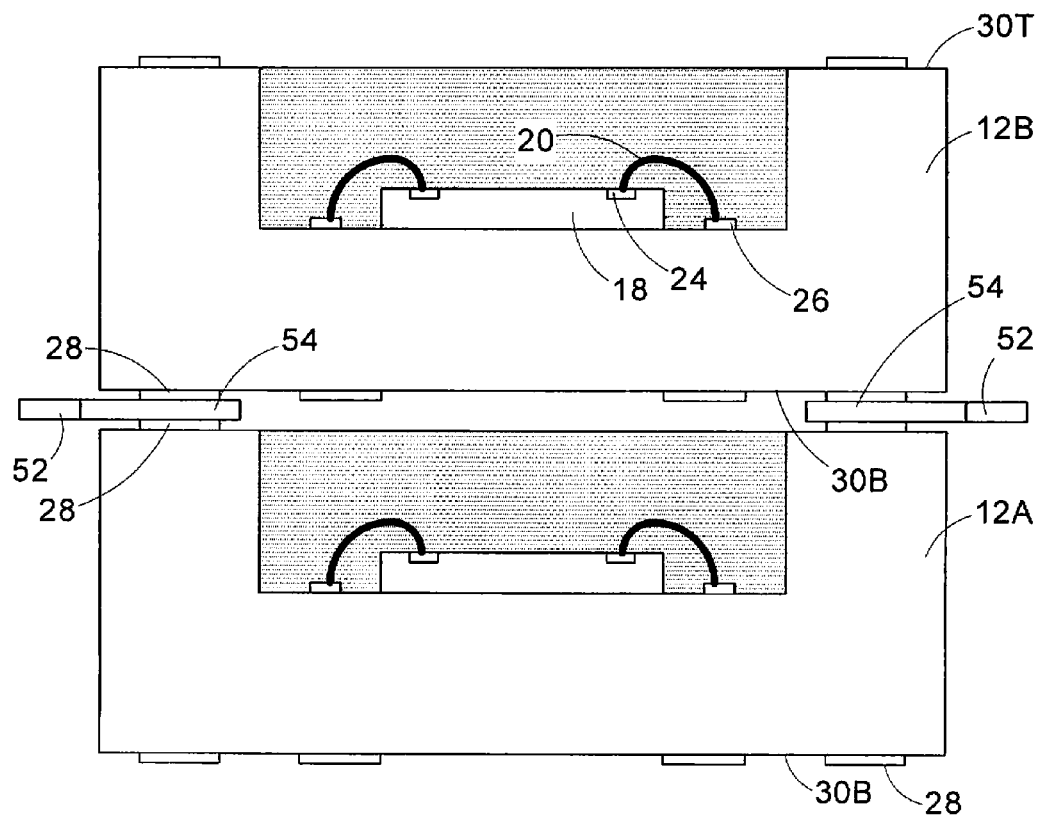

Next, as shown in FIG. 5, the second packaged circuit device 12B is positioned above and aligned with the leadframe 50. During this process, the conductive terminals 28 on the bottom surface 30B of the second packaged circuit device 12B are aligned so as to be conductively coupled to the extensions 54. A solder flux may be applied to the conductive terminals 28 and/or extensions 54 during this process. A second heat treatment process is then performed to reflow the connection between the extensions 54 and the conductive terminals 28 on the bottom surface 30B of the second packaged circuit device 12B.

Figure 6:
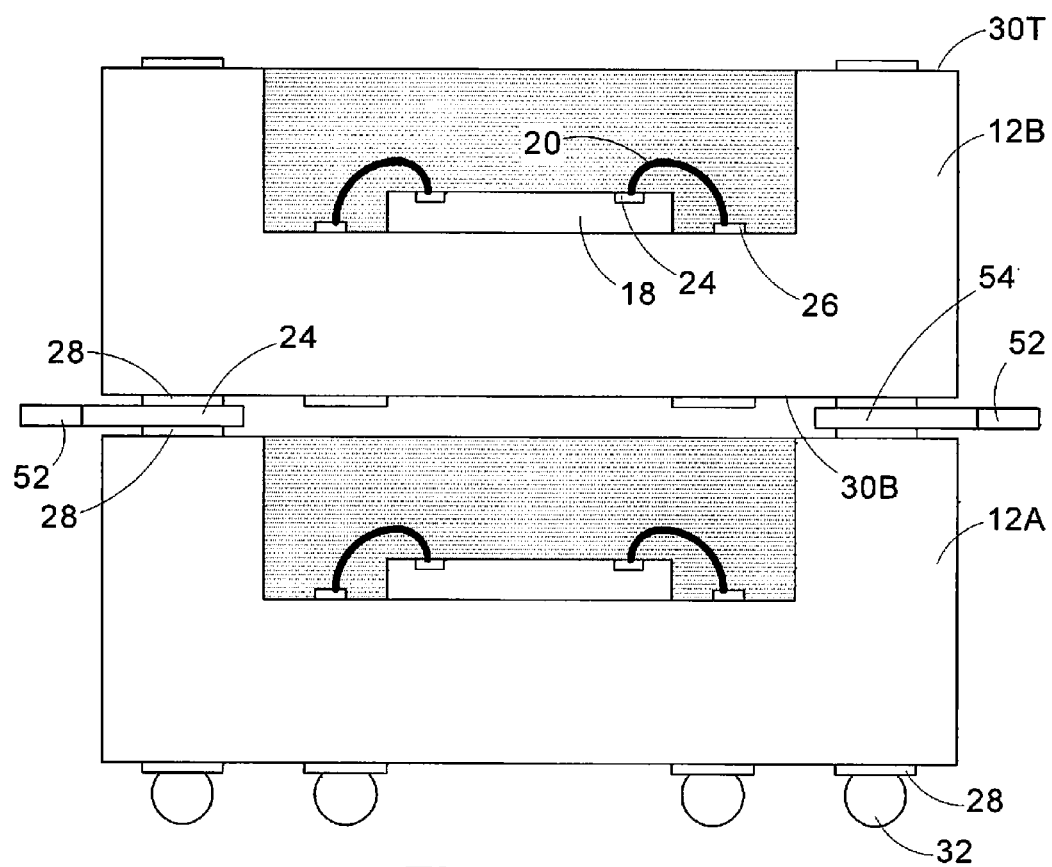
Figure 7:
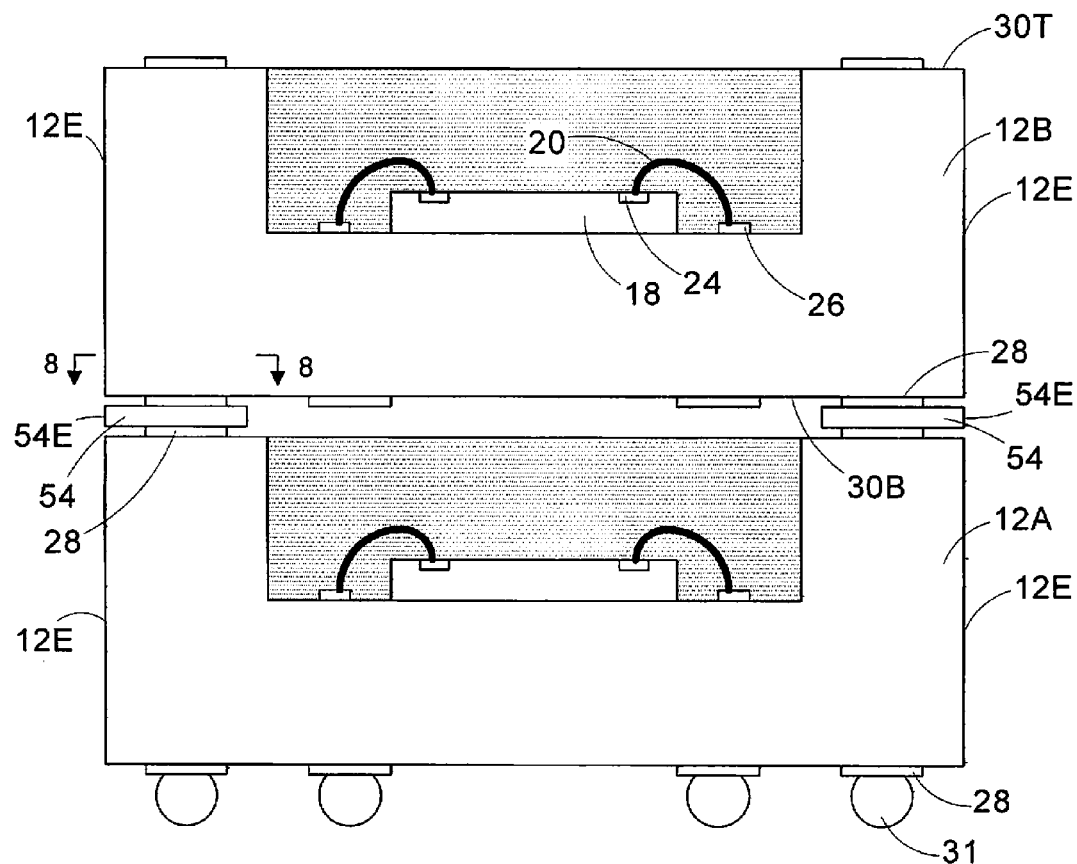
Figure 8:
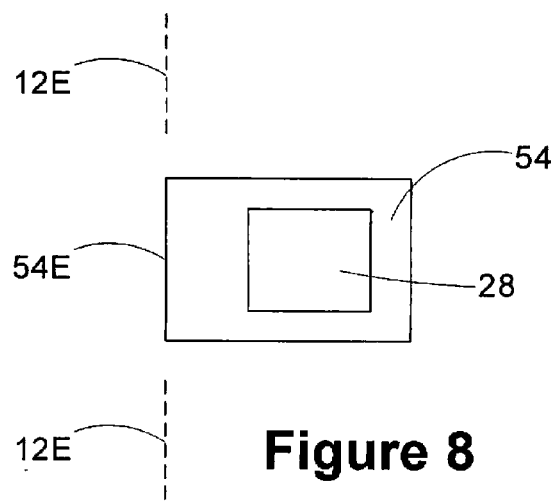
FIG. 8 is a top view of an illustrative conductive contact for stacked packaged integrated circuit devices as disclosed herein.

Thereafter, as shown in FIG. 6, a plurality of solder balls 32 are formed on conductive terminals 28 on the bottom surface 30B of the first packaged integrated circuit device 12A using traditional techniques. Then, the tie bar portions 52 of the leadframe 50 are trimmed to result in the structure depicted in FIG. 7. This trimming process may be performed using any of a variety of known techniques, e.g., a punch. FIG. 3 depicts an illustrative cut line 56 for the leadframe 50. The trimming process results in the singulation of the extensions 54 such that they are not conductively coupled to one another. Also note that an outer edge 54e of the extension 54 is approximately aligned with an edge 12e of the first and second packaged integrated circuit devices 12A, 12B. In some applications, if the first and second packaged integrated circuit devices 12A, 12B are of different physical sizes, then the edge 54e of the extension 54 may only align with the edge of one of the stacked packaged integrated circuit devices. FIG. 8 is a top view of an individual extension 54 and the contact 28 on the bottom of the second packaged integrated circuit device 12A. The extension 54 acts as a generally rectangular, planar conductive member between the stacked packaged integrated circuit devices 12A, 12B.

What is claimed:

1. A device, comprising:
   a first packaged integrated circuit device having a first die positioned in a first cavity formed in a first surface of the first packaged integrated circuit device, wherein the first die is recessed from the first surface and at least partially covered with a first mold material disposed within the first cavity;
   a second packaged integrated circuit device positioned above the first packaged integrated circuit device, the second packaged integrated circuit device having a second die positioned in a second cavity formed in a second surface of the second packaged integrated circuit device, wherein the second die is recessed from the second surface of the second packaged integrated circuit device and at least partially covered with a second mold material disposed within the second cavity, and wherein the second surface is opposite a third surface of the second packaged integrated circuit device and the third surface is adjacent the first surface of the first packaged integrated circuit device; and
   a plurality of extensions of a leadframe attached to corresponding contacts on the first surface of the first packaged integrated circuit device and corresponding contacts on the third surface of the second packaged integrated circuit device.

2. The device of claim 1, wherein the first and second packaged integrated circuit devices comprise a same type of integrated circuit device.

3. The device of claim 1, wherein the first and second packaged integrated circuit devices comprise a different type of integrated circuit device.

4. The device of claim 1, wherein each of the extensions of the leadframe has an outer edge that is substantially aligned with an outer edge of at least one of the first and second packaged integrated circuit devices.

5. The device of claim 4, wherein the extensions of the leadframe have a generally rectangular configuration when viewed from above.

6. A device, comprising:
   a first packaged integrated circuit device having a first surface and including a first die positioned in a first cavity formed in the first packaged integrated circuit device, wherein the first die is recessed from the first surface and at least partially covered with a first mold material disposed in the first cavity;

a second packaged integrated circuit device positioned above the first packaged integrated circuit device having a second surface and a third surface opposite the second surface, the packaged integrated circuit device including a second die positioned in a second cavity formed in the second packaged integrated circuit device, wherein the second die is recessed from the second surface and at least partially covered with a second mold material disposed within the second cavity, and wherein the third surface is adjacent to the first surface of the first packaged integrated circuit device; and a plurality of conductive members conductively coupling corresponding contacts of the first and second packaged integrated circuit devices to one another, wherein each of the plurality of conductive members has an outer edge that is substantially aligned with an outer edge of at least one of the first and second packaged integrated circuit devices.

7. The device of claim 6, wherein each of the conductive members is positioned between and conductively coupled to a conductive terminal formed adjacent a top surface of the first packaged integrated circuit device and a conductive terminal formed adjacent a bottom surface of the second packaged circuit device.

8. The device of claim 7, wherein the conductive members are leadframe extensions.

9. A device, comprising:

a first packaged integrated circuit device having a first top surface and including a first die positioned in a first cavity formed in the top surface of the first packaged integrated circuit device;

a second packaged integrated circuit device positioned above the first packaged integrated circuit device, the second packaged integrated circuit device having a second top surface and a bottom surface opposite the second top surface, the second packaged integrated circuit device including a second die positioned in a second cavity formed in the second top surface of the second packaged integrated circuit device, wherein the second die is recessed from the second top surface of the second packaged integrated circuit device and at least partially covered with a mold material disposed within the second cavity, and wherein the bottom surface is adjacent to the first top surface of the first packaged integrated circuit device; and a plurality of leadframe extensions conductively coupling the first and second packaged integrated circuit devices to one another, wherein each of the leadframe extensions is positioned between and conductively coupled to a conductive terminal formed adjacent the first top surface of the first packaged integrated circuit device and a conductive terminal formed adjacent the bottom surface of the second packaged circuit device, and wherein each of the plurality of leadframe extensions has an outer edge that is substantially aligned with an outer edge of both of the first and second packaged integrated circuit devices.

10. The device of claim 9, wherein the leadframe extensions have a generally rectangular configuration when viewed from above.

* * * * *